(12) United States Patent
Choi et al.

(10) Patent No.: US 6,709,925 B1
(45) Date of Patent: Mar. 23, 2004

(54) SPLIT-GATE FLASH MEMORY CELL AND MANUFACTURING METHOD THEREOF

(75) Inventors: Tae Ho Choi, Kyunggi-do (KR); Jae Yeong Kim, Kyunggi-do (KR)

(73) Assignee: Anam Semiconductor, Inc., Seoul (KR)

( * ) Notice: Subject to any disclaimer, the term of this patent is extended or adjusted under 35 U.S.C. 154(b) by 0 days.

(21) Appl. No.: 10/316,904

(22) Filed: Dec. 12, 2002

(30) Foreign Application Priority Data

Sep. 19, 2002 (KR) .......................................... 2002-57110

(51) Int. Cl.[7] .............................................. H01L 21/336
(52) U.S. Cl. ........................................ 438/257; 438/593
(58) Field of Search ................................ 438/201, 211, 438/257, 264, 266, 267, 593, 594

(56) References Cited

U.S. PATENT DOCUMENTS 6,060,360 A * 5/2000 Lin et al.

6,380,584 B1 * 4/2002 Ogawa

* cited by examiner

Primary Examiner—Phuc T. Dang
(74) Attorney, Agent, or Firm—Bacon & Thomas, PLLC

(57) ABSTRACT

A split-gate flash memory cell and a manufacturing method thereof is provided. After a tunnel oxide layer is formed over a substrate, a peak floating gate layer of conducting material is formed over a portion of the tunnel oxide layer. An inter-gate insulating layer and a control gate layer are formed over the peak floating gate layer and then the control gate layer, the inter-gate insulating layer, the peak floating gate layer and the tunnel oxide layer are sequentially etched down to generate a control gate, an inter-gate insulating region, a peak floating gate and a tunnel oxide region. Finally, a source and a drain are defined adjoining the tunnel oxide region by using a self-align technique.

4 Claims, 6 Drawing Sheets

SPLIT-GATE FLASH MEMORY CELL AND MANUFACTURING METHOD THEREOF

FIELD OF THE INVENTION

The present invention relates to a split-gate flash memory cell and manufacturing method thereof; and, more particularly, to a split-gate flash memory cell with a peak floating gate and manufacturing method thereof.

BACKGROUND OF THE INVENTION

The shape and size of different portions of memory cells affects the performance of the memory cells differently. Thus, with the one-transistor memory cell, which contains one transistor and one capacitor, many variations of this simple cell have been advanced for the purposes for shrinking the size of the cell and, at the same time, improve its performance. The variations include different methods of forming capacitors, with single, double or triple layers of polysilicon, and different materials for the word and bit lines.

Memory devices include electrically erasable and electrically programmable read-only memories (EEPROMs) of flash electrically erasable and electrically programmable read-only memories (flash EEPROMs). Many types of memory cells for EEPROMs or flash EEPROMs may have source and drain regions that are aligned to a floating gate or aligned to spacers.

Referring to FIG. 1, there is shown a conventional split-gate flash memory cell disclosed in U.S. Pat. No. 5,970,371.

On a substrate 10 with a plurality of active regions, e.g., a source 11 and a drain 13, already defined, a tunnel oxide layer 20 is formed. A polysilicon layer 30 is next deposited over the tunnel oxide layer 20. A portion of the polysilicon layer 30 is oxidized by employing a local oxidation of silicon (LOCOS) process to form a LOCOS polyoxide 35. The LOCOS polyoxide 35 is used as a hard mask to etch the remaining portion of the polysilicon layer 30 not covered by the LOCOS polyoxide 35. Since the shape of the LOCOS polyoxide 35 is generally rounded even after performing over-etch, the polysilicon layer 30 is modified as a floating gate 30 with a sharp beak 37. After an inter-gate oxide layer 60 is deposited, a control gate 70 of polisilicon is formed over a portion of the inter-gate oxide layer 60.

In order to program the split-gate flash memory cell, charges in the source 11 are transferred through the tunnel oxide layer 20 to the floating gate 30. On the other hand, in order to erase the split-gate flash memory cell, charges in the floating gate 30 are removed through the inter-gate oxide layer 60 to the control gate 70.

Since, however, the LOCOS polioxide 35 is rounded to form the sharp beak 37 of the floating gate 30, the thickness of oxide between the floating gate 30 and the control gate 70 is not uniform. Further, since the control gate 70 and the floating gate 30 are formed separately, the control gate 70 dose not cover the floating gate 30 completely to reduce a coupling ratio between the floating gate 30 and the control gate 70 and, therefore, the programming/erasing efficiency of the split-gate flash memory cell is considerably reduced.

SUMMARY OF THE INVENTION

It is, therefore, a primary object of the present invention to provide a split-gate flash memory cell with a peak floating gate and manufacturing method thereof to improve a coupling ratio between the peak floating gate and the control gate.

In accordance with one aspect of the present invention, there is provided a method for manufacturing a split-gate flash memory cell, the method comprising the steps of:

(a) providing a substrate;

(b) forming a tunnel oxide layer over the substrate;

(c) forming a peak floating gate layer of conducting material over a portion of the tunnel oxide layer, wherein the peak floating gate layer has a peak structure thereon;

(d) coating an inter-gate insulating layer over the peak floating gate layer and the remaining portion of the tunnel oxide layer and spreading a control gate layer of conducting material over the inter-gate insulating layer;

(e) defining a control gate pattern over the control gate layer;

(f) etching down the control gate layer, the inter-gate insulating layer, the peak floating gate layer and the tunnel oxide layer sequentially to the substrate by using the control gate pattern to generate a control gate, a inter-gate insulating region, a peak floating gate and a tunnel oxide region; and (g) defining a source and a drain adjoining the tunnel oxide region by using a self-align technique.

In accordance with another aspect of the present invention, there is provided a split-gate flash memory cell comprising:

a substrate defined with a source, a drain and a channel region between the source and the drain;

a tunnel oxide region formed over the channel region;

a peak floating gate of conducting material over a portion of the tunnel oxide region, wherein the peak floating gate has a peak structure thereon;

an inter-gate insulating region formed over the peak floating gate and the remaining portion of the tunnel oxide region; and a control gate of conducting material formed over the inter-gate insulating region, wherein the control gate, the inter-gate insulating region, the peak floating gate and the tunnel oxide region are defined with a mask which has a same size as the channel region.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Referring to FIGS. 2a to 2k, there is shown a method for fabricating a split-gate flash memory cell in accordance with a preferred embodiment of the present invention.

Figure 1:
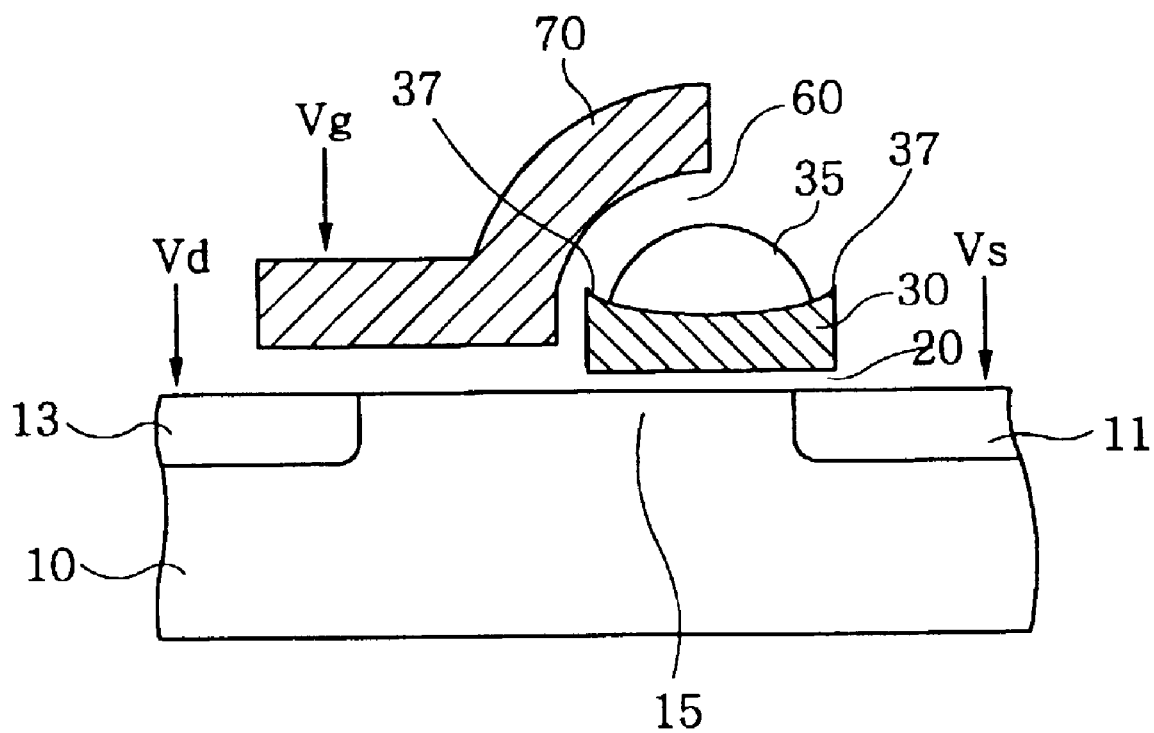
FIG. 1 represents a cross-sectional view of a conventional split-gate flash memory cell.
Figure 2A:
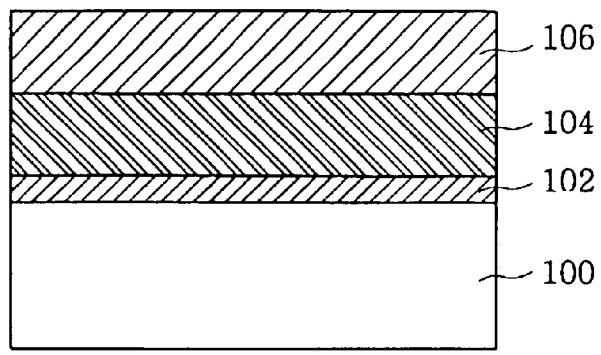
FIGS. 2a to 2k show cross-sectional views for illustrating a manufacturing process of a split-gate flash memory cell in accordance with the present invention.

Referring to FIG. 2a, a substrate 100, preferably a silicon substrate, is provided and a tunnel oxide layer 102 is thermally grown over the substrate 100. Specifically, the tunnel oxide layer 102 may be formed by employing a thermal oxidation process or an atmospheric or low pressure chemical vapor deposition (LPCVD) process.

A floating gate layer 104 of conducting material, e.g., polysilicon, is deposited over the tunnel oxide layer 102 through reduction of $SiH_4$ by using LPCVD. A first insulating layer 106 of insulating material, e.g., silicon nitride, is deposited over the floating gate layer 104.

Figure 2B:
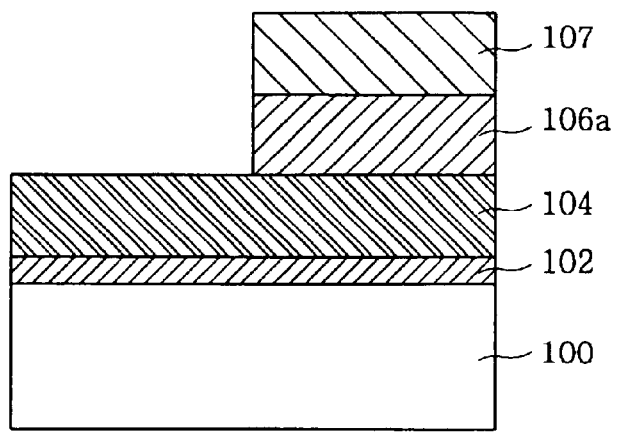

Referring to FIG. 2b, a photoresist layer is spun over the first insulating layer 106 and then the photoresist layer is developed as a first photoresist pattern 107 having patterns corresponding to areas where floating gate layers are to be defined later. The first photoresist pattern 107 is used to etch down a portion of the first insulating layer 106 to the floating gate layer 104 so that an insulating pattern layer 106a may be formed. Then, the first photoresist pattern 107 is removed.

Figure 2C:
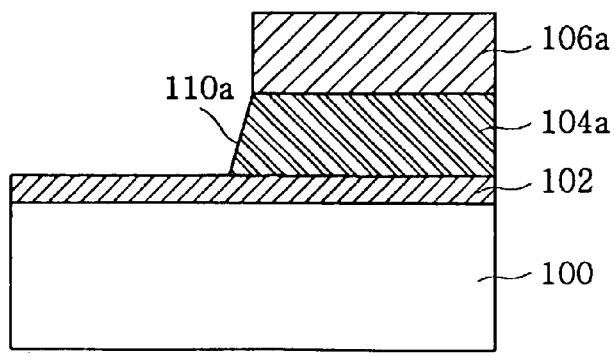

Referring to FIG. 2c, the insulating pattern layer 106a is used as a mask in a dry etching process to etch down steeply a predetermined portion of the floating gate layer 104 to the tunnel oxide layer 102 so that a sloping-patterned floating gate layer 104a with a sloping sidewall 110a may be formed with a portion of top surface of the tunnel oxide layer 102 exposed.

Figure 2D:
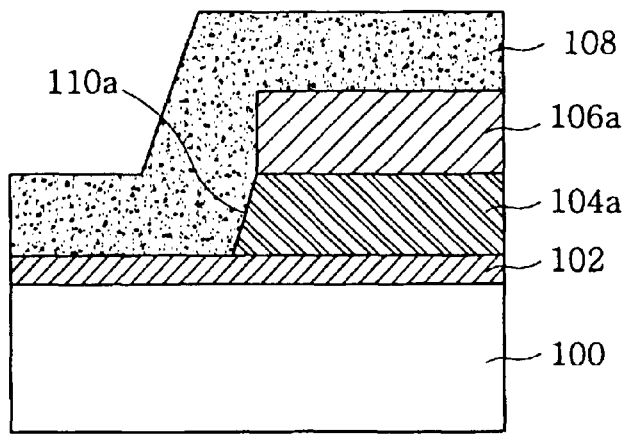
Figure 2E:
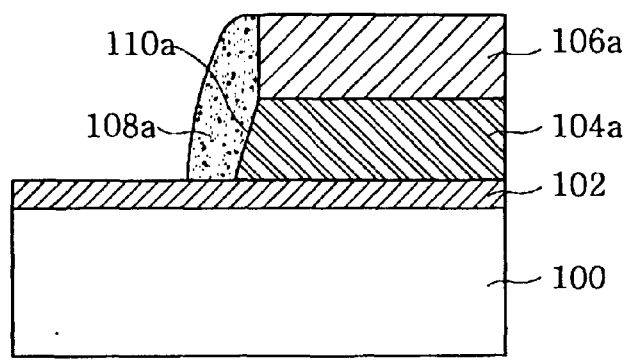

Referring to FIG. 2d, a second insulating layer 108 of insulating material, e.g., silicon nitride, is deposited conformally all over the top surface and the sidewall of the insulating pattern layer 106a, the sloping sidewall 110a of the sloping-patterned floating gate layer 104a and the exposed top surface of the tunnel oxide layer 102. Then, referring to FIG. 2e, the second insulating layer 108 is dry-etched so that an insulating spacer 108a of insulating material is formed covering at least the sloping sidewall 110a of the sloping-patterned floating gate layer 104a. If necessary, the insulating spacer 108a may also be formed on the sidewall of the insulating pattern layer 106a. It is preferable that the insulating spacer 108a is made of a material with an etching selectivity different from that of the insulating pattern layer 106a.

Figure 2F:
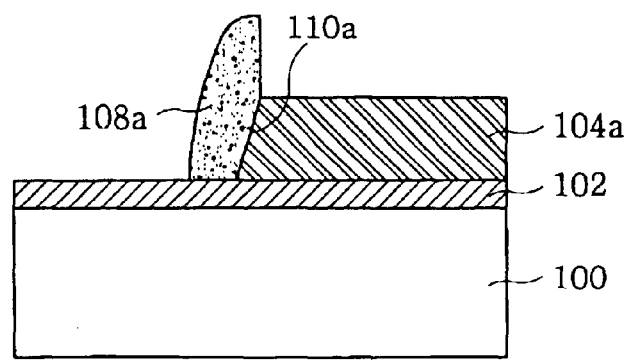

Referring to FIG. 2f, the insulating pattern layer 106a is removed away by using a wet etching process.

Figure 2G:
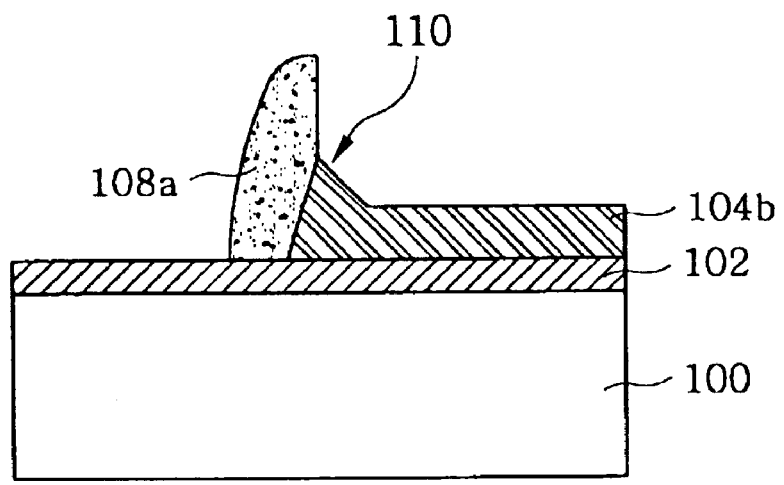

Referring to FIG. 2g, the sloping-patterned floating gate layer 104a is etched down steeply with a predetermined depth by using a dry etching process so that a peak floating gate layer 104b with a peak 110 may be formed. In order to form the peak 110 steeply, the nearer the insulating spacer 108a, the less etched is the sloping-patterned floating gate layer 104a.

Figure 2H:
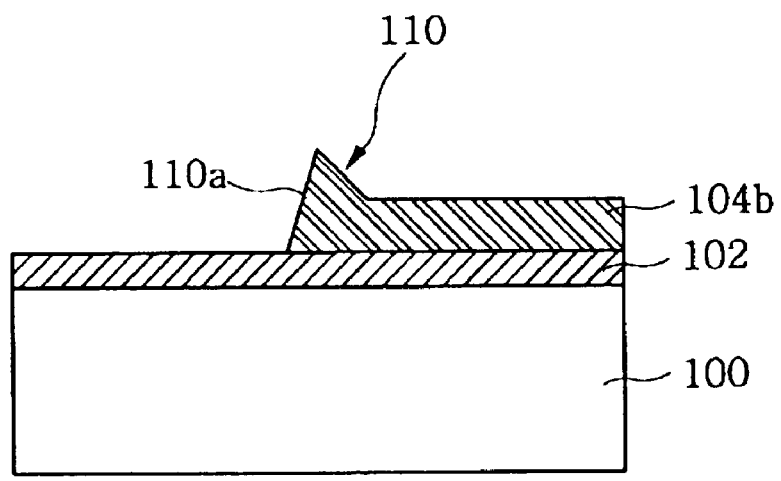

Referring to FIG. 2h, if the insulating spacer 108a is removed away by using a wet etching process, the peak floating gate layer 104b with the peak 110 thereon is formed on a portion of the tunnel oxide layer 102. It is preferable that the peak 110 is formed around the middle of the split-gate flash memory cell to be defined. It is more preferable that the peak 110 is formed near the drain as defined later.

Figure 2I:
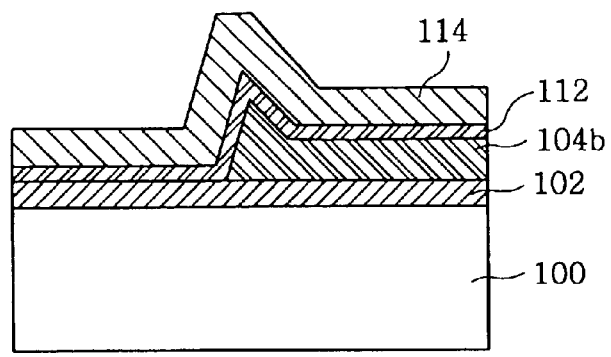

Referring to FIG. 2i, an inter-gate insulating layer 112 of insulating material is conformally coated all over the exposed top surface of the tunnel oxide layer 102 and the peak floating gate layer 104b. It is preferable that the inter-gate insulating layer 112 is uniformly thin. Then, a control gate layer 114 of conducting material is conformally deposited over the inter-gate insulating layer 112. It is preferable that the inter-gate insulating layer 112 is made of one or more complex dielectric films, e.g., of oxide/nitride/oxide and the control gate layer 114 is made of single or complex polysilicons or metals.

Figure 2J:
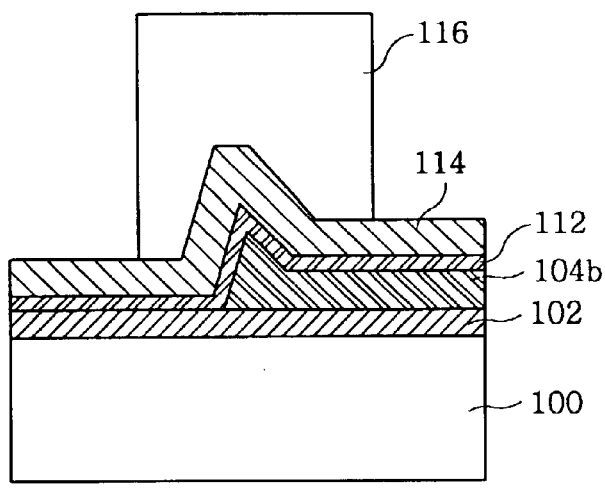

Referring to FIG. 2j, a second photoresist pattern 116 is defined over the control gate layer 114. It is preferable that the second photoresist pattern 116 is of a same size as that of a channel region, wherein the channel region is a region between a source and a drain in a split-gate flash memory cell as illustrated later. Accordingly, it is natural that the second photoresist pattern 116 is located over the peak 110 of peak floating gate layer 104b.

Figure 2K:
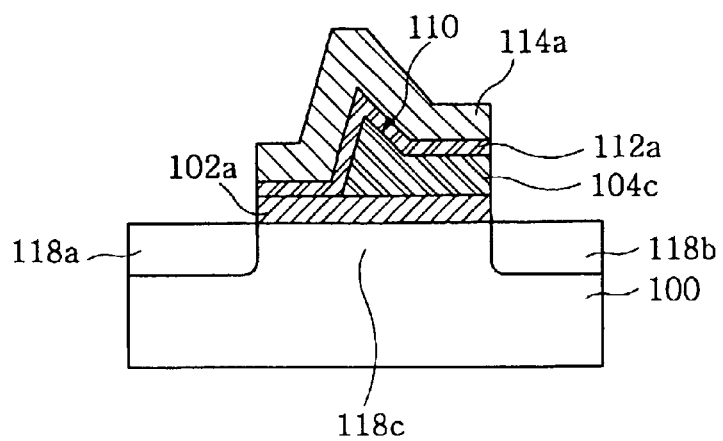

Referring to FIG. 2k, the second photoresist pattern 116 is used to etch down the control gate layer 114, the inter-gate insulating layer 112, the peak floating gate layer 104b and the tunnel oxide layer 102 to the substrate 100 so that a control gate 114a, an inter-gate insulating region 112a, a peak floating gate 104c and a tunnel oxide region 102a may be formed in sequence, e.g., by employing a dry etching process. Since it is natural the second photoresist pattern 116 is of a same size as that of the control gate 114a, the second photoresist pattern 116 may be read as a control gate pattern.

The tunnel oxide region 102a is used to define a drain 118a and a source 118b within the substrate 100 by using a self-align ion injection process, wherein the substrate 100 is sectioned with the drain 118a, the source 118b and a channel region 118c between the drain 118a and the source 118b. Specifically, in an n channel split-gate flash memory cell, n type dopant, e.g., P or As, of a higher concentration is injected to form $n^+$ drain 118a and $n^+$ source 118b.

Since the inter-gate insulating region 112a is formed uniformly thin by using a deposition process and the control gate 114a covers the peak floating gate 104c completely, the coupling ratio between the control gate 114a and the peak floating gate 104c may be increased to thereby improve the erasing efficiency of the split-gate flash memory cell.

Figure 3:
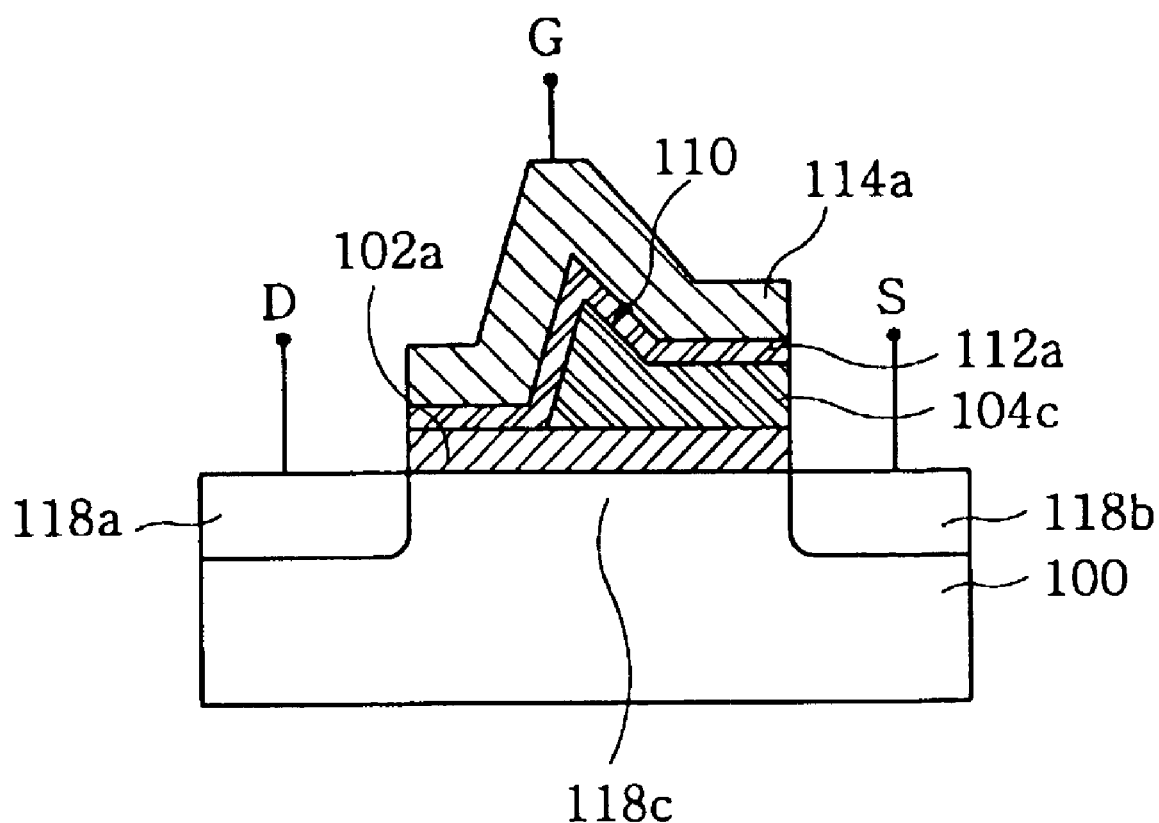
FIG. 3 describes a cross-sectional view of a split-gate flash memory cell in accordance with the present invention.

Referring to FIG. 3, there is shown a split-gate flash memory cell manufactured by using a manufacturing process of a split-gate flash memory cell in accordance with the present invention.

The tunnel oxide region 102a is defined over a portion of the substrate 100. The tunnel oxide region 102a is used as a self-aligning mask to define the source 118b and the drain 118a with the self-align ion injection process. Since, the portion of the substrate 100 under the tunnel oxide region 102a corresponds to the channel region 118c, two end points of the channel region 118c adjoin the source 118b and the drain 118a, respectively.

The peak floating gate 104c of conduction material with the peak 110 is formed over a portion of the tunnel oxide region 102a. It is preferable that the peak 110 is located around the middle point of the tunnel oxide region 102a. It is more preferable that the peak 110 is located near the drain 118a.

Over the remaining portion of the tunnel oxide region 102a and the top surface of the peak floating gate 104c, the inter-gate insulating region 112a is conformally formed with a thin thickness. The inter-gate insulating region 112a is totally covered with the control gate 114a.

The drain 118a, the source 118b and the control gate 114a are connected with a drain voltage D, a source voltage S and a control voltage G, respectively. If the control gate is applied with a high voltage G, a high electric field is formed around the peak 110 so that charges may be transmitted from the peak floating gate 104c to the control gate 114a to increase the erasing speed.

While the invention has been shown and described with respect to the preferred embodiments, it will be understood by those skilled in the art that various changes and modifications may be made without departing from the spirit and scope of the invention as defined in the following claims.

What is claimed is:

1. A method for manufacturing a split-gate flash memory cell, the method comprising the steps of:
   (a) providing a substrate;
   (b) forming a tunnel oxide layer over the substrate;
   (c) forming a tip type peak floating gate layer of conducting material over a portion of said tunnel oxide layer, wherein said tip type peak floating gate layer includes a tip and an angle of said tip is substantially less than 90 degrees;
   (d) forming an inter-gate insulating layer over said tip type peak floating gate layer wherein said inter-gate insulating layer generally follows a topology of said tip type peak floating gate layer;
   (e) forming a control gate layer of conducting material over said inter-gate insulating layer, wherein said control gate layer generally follows a topology of said inter-gate insulating layer and said tip type peak floating gate layer;
   (f) patterning a gate electrode and etching down said control gate layer, said inter-gate insulating layer, said tip type peak floating gate layer, and said tunnel oxide layer;
   (g) defining a source and a drain adjoining the tunnel oxide region by using a self-align technique.

2. The method of claim 1, wherein the step (c) includes the steps of:
   (c1) depositing said floating gate layer of conducting material over the tunnel oxide layer;
   (c2) forming a mask layer of insulating material over said floating gate layer;
   (c3) using said mask layer to etch down a predetermined portion of said floating gate layer steeply to said tunnel oxide layer so that a sloping-patterned floating gate layer with a sloping sidewall is formed;
   (c4) forming a spacer of insulating material to cover at least the sloping sidewall of the sloping-patterned floating gate layer therewith and removing said mask layer; and
   (c5) using the spacer to etch down said sloping-patterned floating gate layer steeply with a predetermined depth so that said tip type peak floating gate layer is formed and removing the spacer.

3. The method of claim 1, wherein said tip is located around the drain.

4. The method of claim 2, wherein said mask layer has an etching selectivity different from that of said spacer.

* * * * *